(12) United States Patent
McCombs, Jr. et al.

(10) Patent No.: US 11,935,580 B2
(45) Date of Patent: Mar. 19, 2024

(54) SYSTEM CACHE PEAK POWER MANAGEMENT

(71) Applicant: Arm Limited, Cambridge (GB)

(72) Inventors: Edward Martin McCombs, Jr., Austin, TX (US); Hsin-Yu Chen, Austin, TX (US)

(73) Assignee: Arm Limited, Cambridge (GB)

( * ) Notice: Subject to any disclaimer, the term of this patent is extended or adjusted under 35 U.S.C. 154(b) by 188 days.

(21) Appl. No.: 17/530,095

(22) Filed: Nov. 18, 2021

(65) Prior Publication Data

US 2023/0154526 A1 May 18, 2023

(51) Int. Cl.
*G11C 7/12* (2006.01)
*G11C 11/4074* (2006.01)
*G11C 11/4076* (2006.01)
*G11C 11/4091* (2006.01)
*G11C 11/4094* (2006.01)

(52) U.S. Cl.
CPC ...... *G11C 11/4091* (2013.01); *G11C 11/4074* (2013.01); *G11C 11/4076* (2013.01); *G11C 11/4094* (2013.01)

(58) Field of Classification Search
CPC ............ G11C 11/4091; G11C 11/4074; G11C 11/4076; G11C 11/4094; G11C 7/222; G11C 5/14; G11C 7/12
See application file for complete search history.

(56) References Cited

U.S. PATENT DOCUMENTS

| | | | |
|---|---|---|---|
| 5,912,853 A * | 6/1999 | Rao | G11C 11/4091 365/207 |
| 11,100,965 B1* | 8/2021 | Sisodia | G11C 8/08 |
| 2001/0021136 A1* | 9/2001 | Bae | G11C 7/22 365/203 |
| 2003/0146950 A1* | 8/2003 | Miyo | G11C 7/12 347/19 |
| 2005/0128837 A1* | 6/2005 | Kim | G11C 29/26 365/203 |
| 2016/0314832 A1* | 10/2016 | Roine | G11C 7/1018 |
| 2021/0110853 A1* | 4/2021 | Gupta | G11C 13/004 |

* cited by examiner

*Primary Examiner* — Mushfique Siddique
(74) *Attorney, Agent, or Firm* — Pramudji Law Group PLLC; Ari Pramudji (57) ABSTRACT

One implementation described herein is related to a device having memory with sense amplifiers and precharge blocks arranged in an array with a first side and a second side. The first side has first sense amplifiers and first precharge blocks coupled together with first bitlines, and the second side has second sense amplifiers and second precharge blocks coupled together with second bitlines. The device has a first delay block coupled to the first precharge blocks in the first side of the array, and the first delay block delays precharge of the first bitlines with a first precharge burst in a multi-burst precharge event. The device has a second delay block coupled to the second precharge blocks in the second side of the array, and the second delay block delays precharge of the second bitlines with a second precharge burst in the multi-burst precharge event.

16 Claims, 4 Drawing Sheets

FIG. 5

SYSTEM CACHE PEAK POWER MANAGEMENT

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, many memory devices utilize power demand along with regulated power designs, and as such, conventional memory devices typically regulate and mange peak power demand so as to reduce overall peak demand on the power supply in memory applications. Generally, power is not managed by dividing power components for shifting peak demand through programmable or fixed logic structures. As such, there exists a need to improve the performance and efficiency of integrated power designs that enhance peak power management targets in modern conventional circuitry.

BRIEF DESCRIPTION OF THE DRAWINGS

Implementations of various memory layout schemes and techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to system cache circuitry that uses multi-burst precharge techniques for peak power management in support of various memory related applications in reference to physical circuit designs. Thus, various implementations of multi-burst precharge circuitry and techniques related thereto for memory applications will be described herein with reference to FIGS. 1-5.

Figure 1:
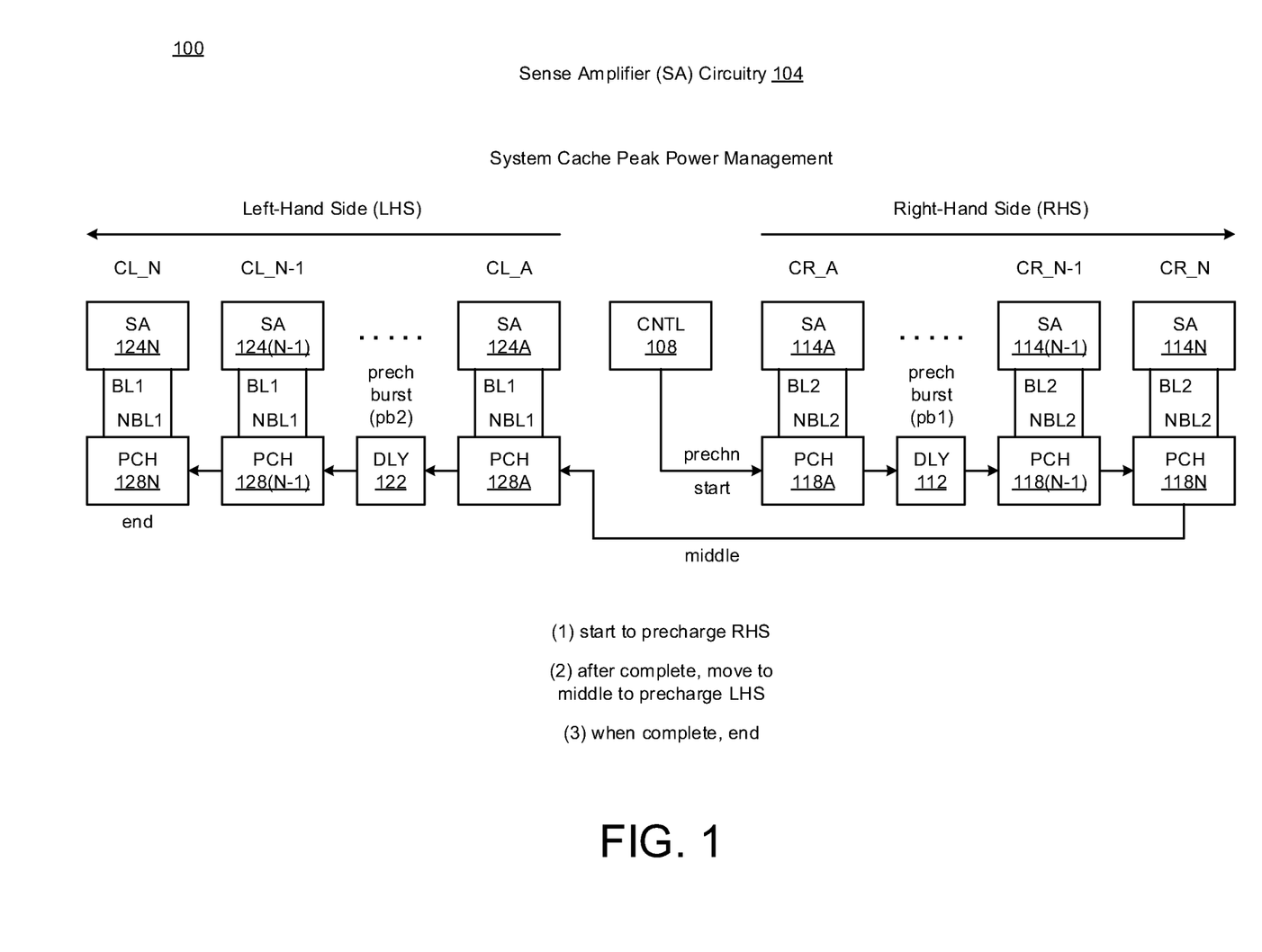
FIG. 1 illustrates a diagram of sense amplifier circuitry for precharging bitlines in accordance with various implementations described herein.

FIG. 1 illustrates a diagram 100 of sense amplifier circuitry 104 for precharging bitlines in accordance with various implementations described herein.

In various implementations, system cache architecture may be implemented with sense amplifier (SA) circuitry and precharge (PCH) circuitry as a system or a device having various integrated circuit (IC) devices and components arranged and coupled together as an assemblage or some combination of parts that provide for physical circuit designs and related component structures. Also, in some instances, a method of designing, providing, fabricating and/or manufacturing system cache architecture as an integrated system or memory device may involve use of IC circuit components described herein so as to implement various related fabrication schemes and techniques associated therewith. Also, system cache architecture may be integrated with computing circuitry and components on a single chip, and the system cache architecture may be implemented and/or incorporated in various types of embedded systems for automotive, computer, electronic, mobile phones, server and Internet-of-things (IoT) applications, including remote sensor nodes.

As shown in FIG. 1, the sense amplifier circuitry 104 may be used for peak power management in system cache applications. In various implementations, the sense amplifier circuitry 104 may include an array of sense amplifiers (SA) 124 that are arranged in columns (CR, CL) with first sense amplifiers (SA 114A, ..., 114(N−1), 114N) disposed in first columns (CR_A, ..., CR_N−1, CR_N) and second amplifiers (SA 124A, ..., 124(N−1), 124N) disposed in second columns (CL_A, ..., CL_N−1, CL_N). In some instances, the first columns (CR_A, ..., CR_N−1, CR_N) refer to right-hand side (RHS) columns in a system cache, and also, the second columns (CL_A, ..., CL_N−1, CL_N) refer to left-hand side (LHS) columns in the system cache. The sense amplifier circuitry 104 may include an array of precharge blocks (PCH) that are arranged in the columns (CR, CL) with first precharge blocks (PCH 118A, ..., 118(N−1), 118N) in the first columns (CR_A, ..., CR_N−1, CR_N) and second precharge blocks (PCH 128A, ..., 128(N−1), 128N) in the second columns (CL_A, ..., CL_N−1, CL_N). The first precharge blocks (PCH 118A, ..., 118(N−1), 118N) may be coupled to the first sense amplifiers (SA 114A, ..., 114(N−1), 114N) in the first columns (CR_A, ..., CR_N−1, CR_N) with first bitlines (BL1, NBL1). The second precharge blocks (PCH 128A, ..., 128(N−1), 128N) may be coupled to the second sense amplifiers (SA 124A, ..., 124(N−1), 124N) in the second columns (CL_A, ..., CL_N−1, CL_N) with second bitlines (BL2, NBL2).

The sense amplifier circuitry 104 may include a first delay block (DLY 112) that is coupled to the first precharge blocks (PCH 118A, ..., 118(N−1), 118N) in the first columns (CR_A, ..., CR_N−1, CR_N), and the first delay block (DLY 112) may be configured to delay precharging of the first bitlines (BL1, NBL1) to a supply voltage (VDD) with a first precharge burst (pb1) in a multi-burst precharge event. The sense amplifier circuitry 104 may include a second delay block (DLY 122) coupled to the second precharge blocks (PCH 128A, ..., 128(N−1), 128N) in the second columns (CL_A, ..., CL_N−1, CL_N), and the second delay block (DLY 122) delays precharging of the second bitlines (BL2, NBL2) to the supply voltage (VDD) with a second precharge burst (pb2) in the multi-burst precharge event.

The sense amplifier circuitry 104 may include a control block (CNTL 108) that is configured to provide a precharge signal (prechn) to the first precharge blocks (PCH 118A, ..., 118(N−1), 118N) in the first columns (CR_A, ..., CR_N−1, CR_N) for precharging of the first bitlines (BL1, NBL1) to the supply voltage (VDD). In some instances, the first delay block (DLY 112) is configured to delay the precharge signal (prechn) provided to the first precharge blocks (CR_A, ..., CR_N−1, CR_N) that is used to precharge the first bitlines (BL1, NBL1) to the supply voltage (VDD) with the first precharge burst (pb1) in the multi-burst precharge event. Further, in some instances, the second precharge blocks (PCH 128A, ..., 128(N−1), 128N)

may receive the precharge signal (prechn) from the first precharge blocks (PCH 118A, ..., 118(N−1), 118N), and also, the second delay block (DLY 122) is configured to delay the precharge signal (prechn) provided to the second precharge blocks (PCH 128A, ..., 128(N−1), 128N) that is used to precharge the second bitlines (BL2, NBL2) to the supply voltage (VDD) with the second precharge burst (pb2) in the multi-burst precharge event.

In various implementations, the second precharge burst (pb2) sequentially follows the first precharge burst (pb1) in the multi-burst precharge event such that the second precharge burst (pb2) occurs after the first precharge burst (pb1). Also, the multi-burst event may provide a similar amount of current as a single burst event, and the first precharge burst (pb1) may have a similar amount of current as the second precharge burst (pb2). Also, each precharge block (PCH) of the precharge blocks may precharge transistors that are activated with the precharge signal (prechn) after a read operation or a write operation so as to thereby precharge the bitlines (BL1/NBL1, BL2/NBL2) to the supply voltage (VDD).

In some implementations, during a first operational stage, the control block (CNTL 108) may start to precharge the right-hand side (RHS) of the system cache array by providing the precharge signal (prechn) to the first precharge blocks (PCH 118A, ..., 118(N−1), 118N) in the first columns (CR_A, ..., CR_N−1, CR_N). Next, after completion of precharging the first bitlines (BL1, NBL1) with the first precharge burst (pb1), the precharge signal (prechn) moves to the middle to precharge the left-hand side (LHS) of the system cache array. Thus, during a second operation stage, the first precharge blocks (PCH 118A, ..., 118(N−1), 118N) may provide the precharge signal (prechn) to the second precharge blocks (PCH 128A, ..., 128(N−1), 128N) in the second columns (CL_A, ..., CL_N−1, CL_N). Next, after completion of precharging the second bitlines (BL2, NBL2) with the second precharge burst (pb2), the precharge sequence ends during a third operation stage.

In some implementations, in reference to the operational stages (i.e., start, middle, end), the precharge signal (prechn) may be provided to the right-hand side (RHS) at the start for precharging the RHS of the array. Next, the precharge signal (prechn) may then loop back around to the middle for precharging the LHS, subsequently. In this way, the loopback may ensure that multiple precharge burst events are non-overlapping and spread-out the charge current needed for the multi-burst precharge event. In some scenarios, the precharge signal (prechn) is simply delayed from side-to-side, i.e., from RHS-to-LHS.

In some implementations, the system cache architecture may be implemented with sense amplifier (SA) circuitry and precharge (PCH) circuitry along with memory circuitry that may include various circuitry such as, e.g., a bitcell array. The bitcell array may have multiple rows of bitcells arranged in columns, and the sense amplifier (SA) circuitry may be coupled to each row of the bitcells in each column of bitcells via complementary bitlines (BL1/NBL1, NBL2/NBL2). Also, the bitcell array may have a number of wordlines (WL) that are coupled between an address decoder and corresponding rows of bitcells in the bitcell array for access to the bitcells based on a selected wordline. Also, each wordline (WL) may have a wordline driver coupled thereto so as to provide wordline signals by way of the wordlines (WL) to the corresponding rows of bitcells in the bitcell array.

Therefore, in some implementations, the system cache may have memory circuitry that is implemented as integrated circuitry (IC) in various types of memory, such as random access memory (RAM), static RAM (SRAM), magneto-resistive RAM (MRAM), and/or any other similar type of similar memory. The memory circuitry may also be implemented as an IC with single-port memory architecture and related circuitry, and the memory circuitry may be integrated with computing circuitry and related components on a single chip. Accordingly, the system cache along with the memory circuitry may be implemented in various embedded systems for various automotive, electronic, computer, mobile and IoT applications.

Moreover, in some instances, the memory circuitry may have the bitcell array with multiple memory cells (or bitcells) arranged in the array. Also, each bitcell may be configured to store at least one data bit value (e.g., a data value related to a logical '0' or '1'). The bitcell array may have any number (N) of bitcells arranged in various applicable configurations, such as, a two-dimensional (2D) memory array having any number of columns (Ncolumns) and any number of rows (Nrows) with the bitcells arranged in a 2D grid pattern.

Figure 2:
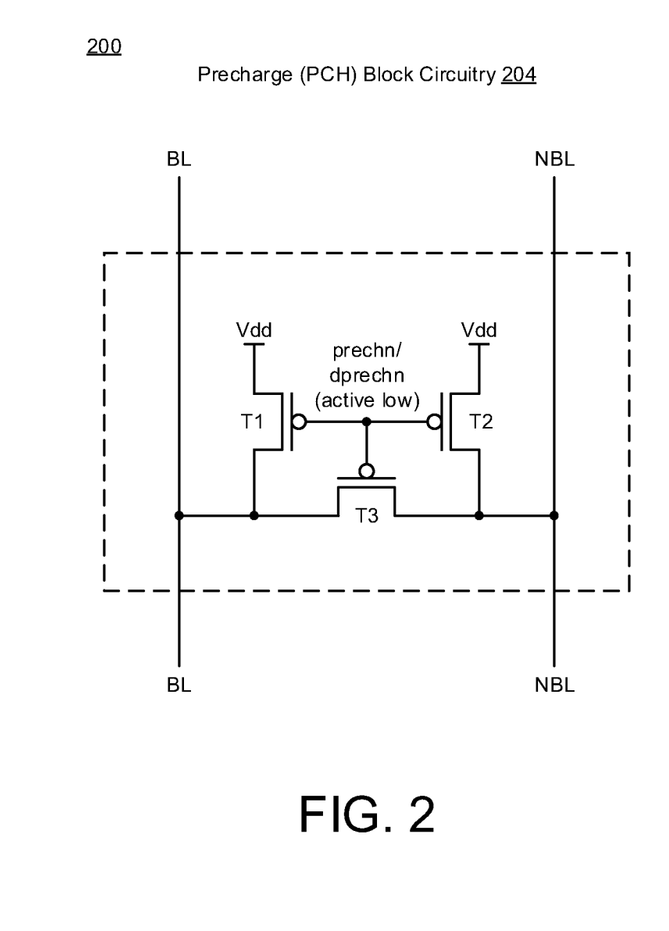
FIG. 2 illustrates a diagram of precharge block circuitry for precharging bitlines in accordance with various implementations described herein.

FIG. 2 illustrates a diagram 200 of precharge block circuitry 204 for precharging bitlines in accordance with various implementations described herein. In various instances, the precharge block circuitry 204 may be implemented as the precharge blocks (PCH) in the right-hand side (RHS) and the left-hand side (PHS) of the SA circuitry 104 in FIG. 1.

In various implementations, the precharge block circuitry 204 may be implemented as a system or a device having various integrated circuit (IC) components that are arranged and coupled together as an assemblage or a combination of parts that provide for physical circuit designs and related structures. In various instances, a method of designing, providing, fabricating and/or manufacturing precharge block circuitry 204 as an integrated system or device may involve use of various IC circuit components described herein so as to implement various related fabrication schemes and/or techniques associated therewith. In addition, the precharge block circuitry 204 may be integrated with computing circuitry and/or components on a single chip, and further, the precharge block circuitry 204 may be implemented and/or incorporated in various types of embedded systems for automotive, computer, electronic, mobile phones, server and IoT applications, including remote sensor nodes.

As shown in FIG. 2, the precharge block circuitry 204 may include one or more precharge transistors (T1, T2, T3) that are activated with the precharge signal (prechn) or a delayed precharge signal (dprechn) after a memory access operation, such as, e.g., a read operation or a write operation. Thus, when activated, precharge transistors (T1, T2, T3) may be used to precharge the bitlines (BL1/NBL1, BL2/NBL2) to the supply voltage (VDD). Also, in some instances, the supply voltage (VDD) may refer to a positive supply voltage having a voltage level greater than zero volts (0V). In some instances, the precharge transistors (T1, T2, T3) may refer to P-type transistors (e.g., PMOS transistors). However, in other instances, the precharge transistors (T1, T2, T3) may be configured with N-type transistors (e.g., NMOS transistors), wherein the supply voltage may refer to ground (e.g., VSS) with a voltage level of equal to or at least near zero volts (0V).

In some implementations, the precharge transistors (T1, T2, T3) may include a first transistor (T1), a second transistor (T2) and a third transistor (T3). In some instances, the first transistor (T1) may be coupled between the supply voltage (VDD) and the bitlines (BL1, BL2), and the second transistor (T2) may be coupled between the supply voltage (VDD) and the complementary bitlines (NBL1, NBL2), respectively. In addition, the third transistor (T3) may be coupled between the bitlines (BL1/NBL1, BL2/NBL2). Also, in some instances, the precharge signal (prechn/dprechn) may be coupled to the gates of the precharge transistors (T1, T2, T3) for activation so as to precharge the bitlines (BL1/NBL1, BL2/NBL2).

Figure 3:
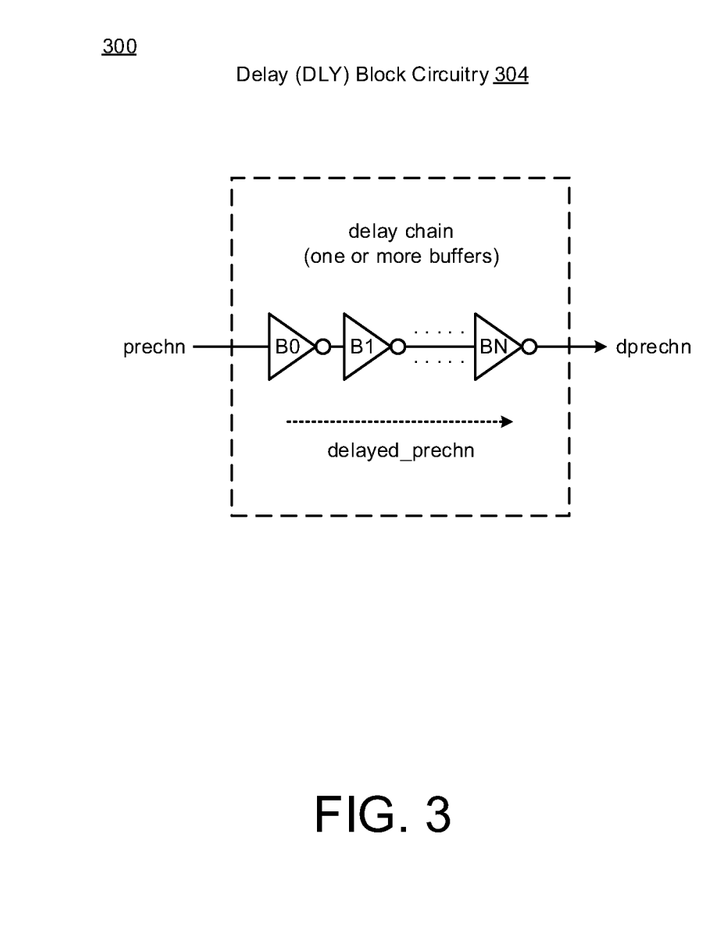
FIG. 3 illustrates a diagram of delay block circuitry for delaying a precharging signal in accordance with various implementations described herein.

FIG. 3 illustrates a diagram 300 of delay block circuitry 304 to delay precharging the bitlines in accordance with various implementations described herein. In some instances, the delay block circuitry 304 may be implemented as the delay blocks (DLY) in the right-hand side (RHS) and the left-hand side (PHS) of the SA circuitry 104 in FIG. 1.

In various implementations, the delay block circuitry 304 may be implemented as a system or a device having various integrated circuit (IC) components that are arranged and coupled together as an assemblage or a combination of parts that provide for physical circuit layout designs and related structures. In various instances, a method of designing, providing, fabricating and/or manufacturing delay block circuitry 304 as an integrated system or device may involve use of IC circuit components described herein so as to implement various related fabrication schemes and/or techniques associated therewith. Also, the delay block circuitry 304 may be integrated with various computing circuitry and/or components on a single chip, and further, the delay block circuitry 304 may be implemented and/or incorporated in various types of embedded systems for automotive, computer, electronic, mobile phones, server and IoT applications, including remote sensor nodes.

As shown in FIG. 3, the delay block circuitry 304 may include one or more buffers (B0, B1, . . . , BN) that are coupled in series as a delay chain so as to receive the precharge signal (prechn), delay the precharge signal (prechn), and then provide a delayed precharge signal (dprechn) as output. In various instances, the delay chain may have any number (N) of buffers (B0, B1, . . . , BN) arranged in series. In other instances, the one or more buffers (B0, B1, . . . , BN) may be implemented with one or more inverters so as to achieve similar results of generating and providing the delayed precharge signal (dprechn).

In reference to FIGS. 1-3, various implementations described herein are directed to a system cache that uses multi-burst precharge techniques for peak power management for supporting memory applications in physical layout designs. The system cache has sense amplifiers (SA) and precharge blocks (PCH) that are arranged in an array with a right-hand side (RHS) and a left-hand side (LHS). The right-hand side (RHS) has first sense amplifiers 114 and first precharge blocks 118 coupled together with first bitlines (BL1/NBL1), and also, the left-hand side (LHS) has second sense amplifiers 124 and second precharge blocks 128 coupled together with second bitlines (BL2/NBL2). The first delay block 112 may be coupled to the first precharge blocks 114 in the right-hand side (RHS) of the array, and the first delay block 112 is configured to delay precharge of first bitlines (BL1/NBL1) with the first precharge burst (pb1) in the multi-burst precharge event. The second delay block 122 may be coupled to the second precharge blocks 128 in the left-hand side (LHS) of the array, and the second delay block 122 is configured to delay precharge of the second bitlines (BL2/NBL2) with the second precharge burst (pb2) in the multi-burst precharge event.

In some implementations, the right-hand side (RHS) of the array has the first sense amplifiers 114 and the first precharge blocks 118 arranged in first columns (CR), and the left-hand side (LHS) of the array has the second sense amplifiers 124 and the second precharge blocks 128 arranged in second columns (CL). The first delay block 112 is coupled to the first precharge blocks 118 in the first columns (CR), and the second delay block 122 is coupled to the second precharge blocks 128 in the second columns (CL). Also, the first delay block 112 may delay precharging of the first bitlines (BL1/NBL1) to the supply voltage (VDD) with the first precharge burst (pb1) in the multi-burst precharge event, and the second delay block 122 may delay precharging of the second bitlines (BL2/NBL2) to the supply voltage (VDD) with the second precharge burst (pb2) in the multi-burst precharge event.

In some implementations, the control block 108 may provide the precharge signal (prechn) to the first precharge blocks 118 in the right-hand side (RHS) for precharging of the first bitlines (BL1/NBL1) to the supply voltage (VDD). Also, the first delay block 112 may be configured to delay the precharge signal (prechn) provided to the first precharge blocks 118 that is used to precharge the first bitlines (BL1/NBL1) to the supply voltage (VDD) with the first precharge burst (pb1) in the multi-burst precharge event. The first precharge blocks 118 may be configured to provide the precharge signal (prechn) to the second precharge blocks 128, and also, the second delay block 122 may be configured to delay the precharge signal (prechn) provided to the second precharge blocks 128 that is used to precharge the second bitlines (BL2/NBL2) to the supply voltage (VDD) with the second precharge burst (pb2) in the multi-burst precharge event. Also, in some instances, as shown and described in reference to FIG. 4, the second precharge burst (pb2) sequentially follows the first precharge burst (pb1) in the multi-burst precharge event such that the second precharge burst (pb2) occurs after the first precharge burst (pb1). Also, the multi-burst event may provide a similar amount of current as a single burst event, and also, the first precharge burst (pb1) may have a similar amount of current as the second precharge burst (pb2).

Figure 4:
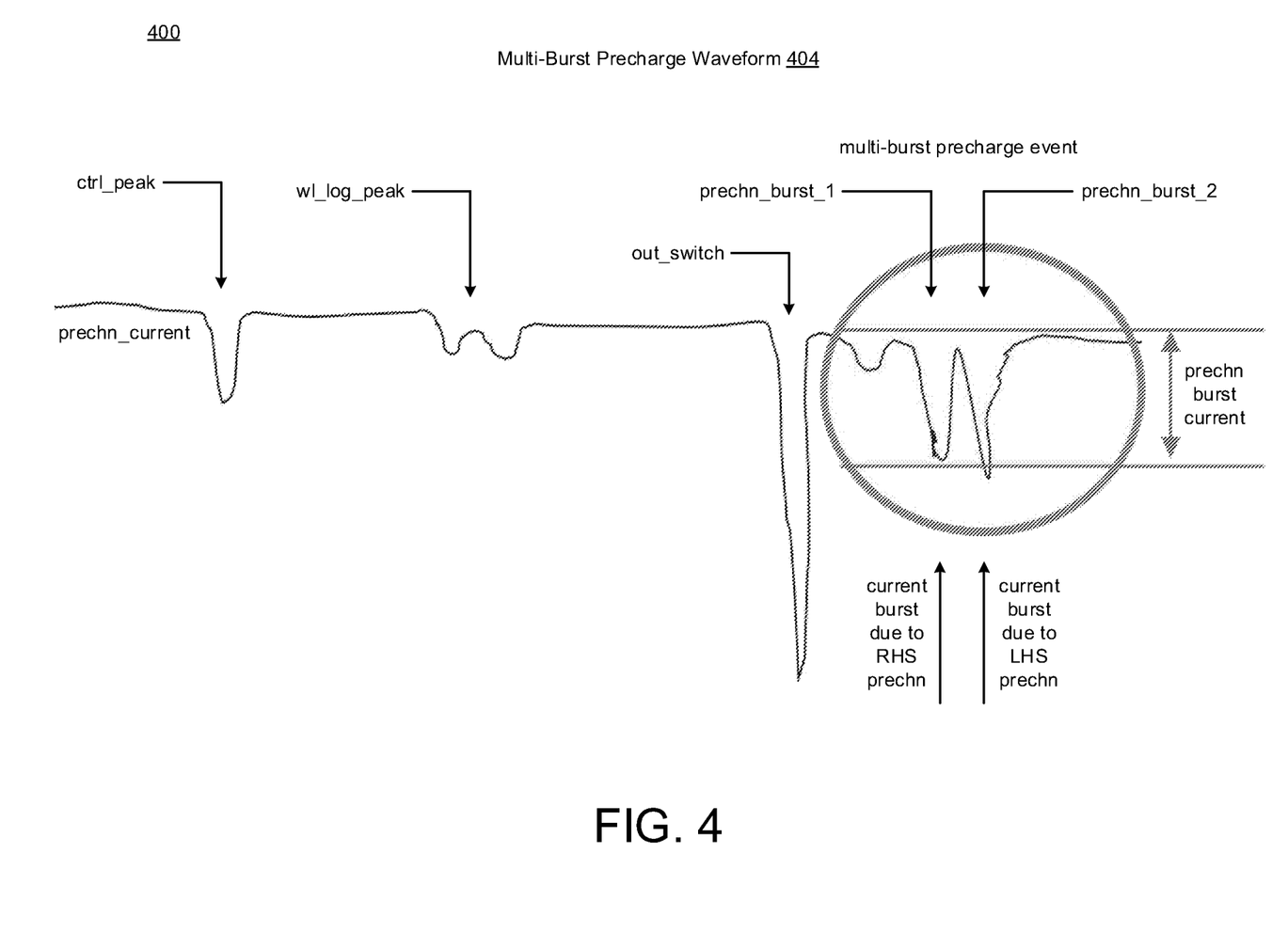
FIG. 4 illustrates a waveform diagram of a multi-burst precharging technique in accordance with various implementations described herein.

FIG. 4 illustrates a graphical diagram 400 of a multi-burst precharge waveform 404 in accordance with various implementations described herein.

As shown in FIG. 4, the multi-burst precharge waveform 404 is an operational waveform that provides a precharge signal (prechn) as a precharge current (prechn_current) having a multi-burst precharge event. In various implementations, the multi-burst precharge event has multiple precharge (prechn) burst currents, including a first precharge burst current (prechn_burst_1) and a second precharge burst current (prechn_burst_2). Also, in various instances, the first precharge burst current (prechn_burst_1) may refer to a first current burst due to a right-hand side (RHS) precharge burst, and in addition, the second precharge burst current (prechn_burst_2) may refer to a second current burst due to a left-hand side (LHS) precharge burst. In some instances, the first precharge burst current (prechn_burst_1) may refer to a first peak event associated with peak power management of a system cache, and also, the second precharge burst current (prechn_burst_2) may refer to a second peak event associated with peak power management of the system cache.

In some implementations, the precharge current (prechn_current) may have other events associated with operating the precharge (PCH) circuitry. For instance, the precharge current (prechn_current) may have various other operational peaks including a control peak (ctrl_peak), a wordline logic peak (wl_log_peak), and an output switching peak (out_switch). The behavioral characteristics of the other operational peaks may or may not be associated with the first precharge burst current (prechn_burst_1) and/or the second precharge burst current (prechn_burst_2) of the multi-burst precharge event.

Figure 5:
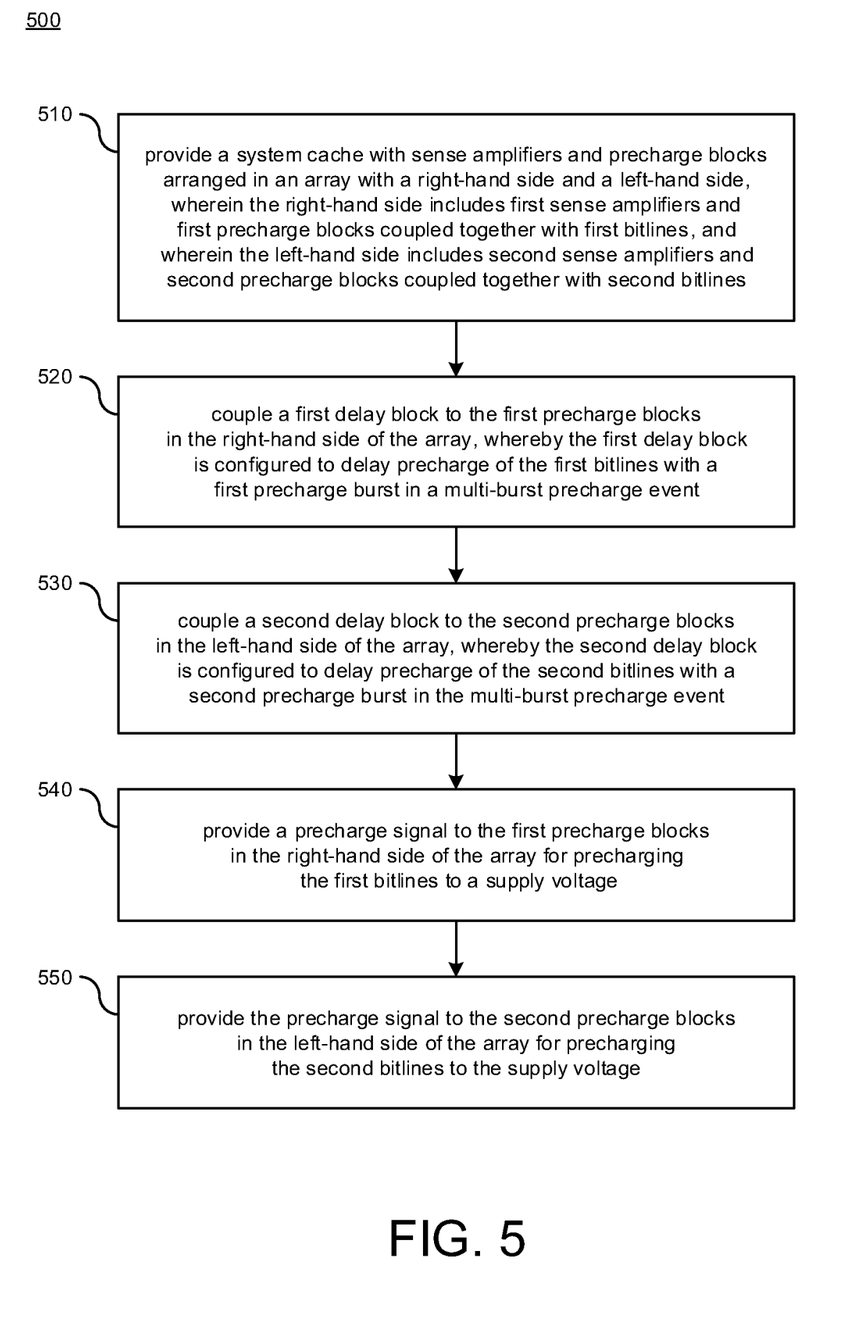
FIG. 5 illustrates a diagram of a method for a multi-burst precharging technique in accordance with various implementations described herein.

FIG. 5 illustrates a diagram of a method 500 for providing multi-burst precharging techniques in accordance with various implementations described herein. Also, as described herein, method 500 may be used so as to delay precharging signals for system cache peak power management in bitline precharging operations, schemes and/or techniques.

It should be understood that even though method 500 indicates a particular order of operation execution, in some cases, various portions of operations may be executed in a different order, and on different systems. In other cases, additional operations and/or steps may be added to and/or omitted from method 500. Also, method 500 may be implemented in hardware and/or software. For instance, if implemented in hardware, method 500 may be implemented with various components and/or circuitry, as described in FIGS. 1-4. Also, in other instances, if implemented in software, method 500 may be implemented as a program or software instruction process that provides multi-burst precharge circuitry for various bitline precharging operations, as described herein. Also, if implemented in software, instructions related to implementing method 500 may be stored and/or recorded in memory, such as, e.g., a database. In some implementations, a computer or various other types of computing devices with a processor and memory may be configured to perform method 500.

As described in reference to FIG. 5, the method 500 may be used for fabricating and/or manufacturing, or causing to be fabricated and/or manufactured, an integrated circuit (IC) that implements various bitline precharging schemes and techniques in physical design as described herein so as to provide system cache peak power management techniques in association with memory related applications using multi-burst precharge circuitry, devices, components and/or circuitry as described herein.

At block 510, method 500 may provide a system cache with sense amplifiers and precharge blocks arranged in an array with a right-hand side and a left-hand side. In various instances, the right-hand side may include first sense amplifiers and first precharge blocks coupled together with first bitlines, and also, the left-hand side may include second sense amplifiers and second precharge blocks coupled together with second bitlines. At block 520, method 500 may couple a first delay block to the first precharge blocks in the right-hand side of the array, whereby the first delay block is configured to delay precharge of the first bitlines with a first precharge burst in a multi-burst precharge event. At block 530, method 500 may couple a second delay block to the second precharge blocks in the left-hand side of the array, whereby the second delay block is configured to delay precharge of the second bitlines with a second precharge burst in the multi-burst precharge event.

At block 540, method 500 may provide a precharge signal to the first precharge blocks in the right-hand side of the array for precharging the first bitlines to a supply voltage, and at block 550, method 500 may also provide the precharge signal to the second precharge blocks in the left-hand side of the array for precharging the second bitlines to the supply voltage. In some instances, the first delay block may be configured to delay the precharge signal provided to the first precharge blocks that is used to precharge the first bitlines to the supply voltage with the first precharge burst in the multi-burst precharge event. Also, in some instances, the second delay block may be configured to delay the precharge signal provided to the second precharge blocks that is used to precharge the second bitlines to the supply voltage with the second precharge burst in the multi-burst precharge event.

In some implementations, the right-hand side of the array may have the first sense amplifiers and the first precharge blocks arranged in first columns, and the left-hand side of the array may have the second sense amplifiers and the second precharge blocks arranged in second columns. Also, the first delay block may be coupled to the first precharge blocks in the first columns, and the second delay block may be coupled to the second precharge blocks in the second columns. In addition, the first delay block may delay precharging of the first bitlines to a supply voltage with the first precharge burst in the multi-burst precharge event, and also, the second delay block may delay precharging of the second bitlines to the supply voltage with the second precharge burst in the multi-burst precharge event.

In some implementations, method 500 may provide a control block configured to provide a precharge signal to the first precharge blocks in the right-hand side of the array for precharging of the first bitlines to a supply voltage. The first delay block may be configured to delay the precharge signal provided to the first precharge blocks that is used to precharge the first bitlines to the supply voltage with the first precharge burst in the multi-burst precharge event. The first precharge blocks may be configured to provide the precharge signal to the second precharge blocks. The second delay block may be configured to delay the precharge signal provided to the second precharge blocks that is used to precharge the second bitlines to the supply voltage with the second precharge burst in the multi-burst precharge event.

In some implementations, the second precharge burst may sequentially follow the first precharge burst in the multi-burst precharge event such that the second precharge burst occurs after the first precharge burst. The multi-burst event may provide a similar amount of current as a single burst event, and wherein the first precharge burst has a similar amount of current as the second precharge burst. Also, each precharge block of the precharge blocks may include precharge transistors that may be activated with a precharge signal after a read operation or a write operation so as to precharge the bitlines to the supply voltage. Moreover, in some instances, the supply voltage may refer to a positive supply voltage (VDD) with a voltage level at least greater than zero volts (0V).

In various implementations, method 500 may be used to manufacture, or cause to be manufactured, an integrated circuit having the system cache memory circuitry with the capability of utilizing the multi-burst precharge event. In some instances, the system cache memory circuitry may be used in various memory related applications for imprioved system cache peak power management, in manner as described herein.

It should be intended that the subject matter of the claims not be limited to various implementations and/or illustrations provided herein, but should include any modified forms of those implementations including portions of implementations and combinations of various elements in reference to different implementations in accordance with the claims. It should also be appreciated that in development of any such implementation, as in any engineering or design project, numerous implementation-specific decisions should be made to achieve developers' specific goals, such as, e.g., compliance with system-related constraints and/or business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device with memory having sense amplifiers and precharge blocks arranged in an array with a first side and a second side. The first side may include first sense amplifiers and first precharge blocks coupled together with first bitlines, and the second side may include second sense amplifiers and second precharge blocks coupled together with second bitlines. The device may have a first delay block coupled to the first precharge blocks in the first side of the array, and the first delay block is configured to delay precharge of the first bitlines with a first precharge burst in a multi-burst precharge event. Also, the device may have a second delay block coupled to the second precharge blocks in the second side of the array, and the second delay block is configured to delay precharge of the second bitlines with a second precharge burst in the multi-burst precharge event.

Described herein are various implementations of a device. The device may have an array of sense amplifiers arranged in columns with first sense amplifiers in first columns and second amplifiers in second columns. The device may have an array of precharge blocks arranged in the columns with first precharge blocks coupled to the first sense amplifiers in the first columns and second precharge blocks coupled to the second sense amplifiers in the second columns. The device may have a first delay block coupled to the first precharge blocks in the first columns, and also, the first delay block delays precharging of first bitlines with a first precharge burst in a multi-burst precharge event. The device may have a second delay block coupled to the second precharge blocks in the second columns, and also, the second delay block delays precharging of second bitlines with a second precharge burst in the multi-burst precharge event.

Described herein are various implementations of a method. The method may provide a memory with sense amplifiers and precharge blocks arranged in an array with a first side and a second side. The first side may include first sense amplifiers and first precharge blocks coupled together with first bitlines, and the second side may include second sense amplifiers and second precharge blocks coupled together with second bitlines. The method may couple a first delay block to the first precharge blocks in the first side of the array, whereby the first delay block is configured to delay precharge of the first bitlines with a first precharge burst in a multi-burst precharge event. The method may couple a second delay block to the second precharge blocks in the second side of the array, whereby the second delay block is configured to delay precharge of the second bitlines with a second precharge burst in the multi-burst precharge event.

Reference has been made in detail to various implementations, examples of which are illustrated in accompanying drawings and figures. In the following detailed description, numerous specific details are set forth to provide a thorough understanding of the disclosure provided herein. However, the disclosure provided herein may be practiced without these specific details. In various implementations, well-known methods, procedures, components, circuits and networks have not been described in detail so as not to unnecessarily obscure details of the embodiments.

It should also be understood that, although various terms first, second, etc. may be used herein to describe various elements, these elements should not be limited by these terms. These terms are only used to distinguish one element from another. For instance, a first element could be termed a second element, and, similarly, a second element could be termed a first element. Also, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and various other similar terms that indicate relative positions above or below a given point or element may be used in connection with various implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, specific features and/or acts described above are disclosed as example forms of implementing the claims.

What is claimed is:

1. A device comprising:
   memory having sense amplifiers and precharge blocks arranged in an array with a first side and a second side, wherein the first side includes first sense amplifiers and first precharge blocks coupled together with first bitlines, and wherein the second side includes second sense amplifiers and second precharge blocks coupled together with second bitlines;
   a first delay block coupled to the first precharge blocks in the first side of the array, wherein the first delay block is configured to delay precharge of the first bitlines with a first precharge burst in a multi-burst precharge event;
   a second delay block coupled to the second precharge blocks in the second side of the array, wherein the second delay block is configured to delay precharge of the second bitlines with a second precharge burst in the multi-burst precharge event; and
   a control block that provides a precharge signal to the first precharge blocks in the first side of the array for precharging of the first bitlines to a supply voltage, wherein the first precharge blocks are configured to provide the precharge signal to the second precharge blocks.

2. The device of claim 1, wherein:
the memory comprises a system cache,
the first side of the array has the first sense amplifiers and the first precharge blocks arranged in first columns, and
the second side of the array has the second sense amplifiers and the second precharge blocks arranged in second columns.

3. The device of claim 2, wherein the first delay block is coupled to the first precharge blocks in the first columns, and wherein the second delay block is coupled to the second precharge blocks in the second columns.

4. The device of claim 3, wherein:
the first delay block delays precharging of the first bitlines to a supply voltage with the first precharge burst in the multi-burst precharge event, and
the second delay block delays precharging of the second bitlines to the supply voltage with the second precharge burst in the multi-burst precharge event.

5. The device of claim 1, wherein:
the first delay block is configured to delay the precharge signal provided to the first precharge blocks that is used to precharge the first bitlines to the supply voltage with the first precharge burst in the multi-burst precharge event.

6. The device of claim 5, wherein:
the second delay block is configured to delay the precharge signal provided to the second precharge blocks that is used to precharge the second bitlines to the supply voltage with the second precharge burst in the multi-burst precharge event.

7. The device of claim 1, wherein each precharge block of the precharge blocks has precharge transistors that are activated with a precharge signal after a read operation or a write operation so as to precharge the bitlines to the supply voltage.

8. A device comprising:
memory having sense amplifiers and precharge blocks arranged in an array with a first side and a second side, wherein the first side includes first sense amplifiers and first precharge blocks coupled together with first bitlines, and wherein the second side includes second sense amplifiers and second precharge blocks coupled together with second bitlines;
a first delay block coupled to the first precharge blocks in the first side of the array, wherein the first delay block is configured to delay precharge of the first bitlines with a first precharge burst in a multi-burst precharge event; and
a second delay block coupled to the second precharge blocks in the second side of the array, wherein the second delay block is configured to delay precharge of the second bitlines with a second precharge burst in the multi-burst precharge event,
wherein the second precharge burst sequentially follows the first precharge burst in the multi-burst precharge event such that the second precharge burst occurs after the first precharge burst, or
wherein the multi-burst event provides a similar amount of current as a single burst event, and wherein the first precharge burst has a similar amount of current as the second precharge burst.

9. A device comprising:
an array of sense amplifiers arranged in columns with first sense amplifiers in first columns and second amplifiers in second columns;
an array of precharge blocks arranged in the columns with first precharge blocks coupled to the first sense amplifiers in the first columns and second precharge blocks coupled to the second sense amplifiers in the second columns;
a first delay block coupled to the first precharge blocks in the first columns, wherein the first delay block delays precharging of first bitlines with a first precharge burst in a mufti-burst precharge event; and
a second delay block coupled to the second precharge blocks in the second columns, wherein the second delay block delays precharging of second bitlines with a second precharge burst in the multi-burst precharge event,
wherein the second precharge burst sequentially follows the first precharge burst in the multi-burst precharge event such that the second precharge burst occurs after the first precharge burst, or
wherein the multi-burst event provides a similar amount of current as a single burst event, and wherein the first precharge burst has a similar amount of current as the second precharge burst.

10. The device of claim 9, wherein:
the first precharge blocks are coupled to the first sense amplifiers in the first columns with the first bitlines, and the second precharge blocks are coupled to the second sense amplifiers in the second columns with the second bitlines,
the first delay block is coupled to the first precharge blocks in the first columns, and the first delay block delays precharging of the first bitlines to a supply voltage with the first precharge burst in the multi-burst precharge event; and
the second delay block is coupled to the second precharge blocks in the second columns, and the second delay block delays precharging of the second bitlines to the supply voltage with the second precharge burst in the multi-burst precharge event.

11. The device of claim 9, further comprising:
a control block that provides a precharge signal to the first precharge blocks in the first columns for precharging of the first bitlines to the supply voltage,
wherein the first delay block is configured to delay the precharge signal provided to the first precharge blocks that is used to precharge the first bitlines to the supply voltage with the first precharge burst in the multi-burst precharge event.

12. The device of claim 11, wherein:
the second precharge blocks receive the precharge signal from the first precharge blocks, and
the second delay block is configured to delay the precharge signal provided to the second precharge blocks that is used to precharge the second bitlines to the supply voltage with the second precharge burst in the multi-burst precharge event.

13. The device of claim 9, wherein:
the first columns comprise first side columns in a system cache, and the second columns comprise second side columns in the system cache, and
each precharge block of the precharge blocks has precharge transistors that are activated with a precharge signal after a read operation or a write operation so as to precharge the bitlines to the supply voltage.

14. A method comprising:

providing a memory with sense amplifiers and precharge blocks arranged in an array with a first side and a second side, wherein the first side includes first sense amplifiers and first precharge blocks coupled together with first bitlines, and wherein the second side includes second sense amplifiers and second precharge blocks coupled together with second bitlines;

coupling a first delay block to the first precharge blocks in the first side of the array, whereby the first delay block is configured to delay precharge of the first bitlines with a first precharge burst in a multi-burst precharge event; and coupling a second delay block to the second precharge blocks in the second side of the array, whereby the second delay block is configured to delay precharge of the second bitlines with a second precharge burst in the multi-burst precharge event; and coupling a control block to the first precharge blocks, wherein the control block provides a precharge signal to the first precharge blocks in the first side of the array for precharging of the first bitlines to a supply voltage, and wherein the first precharge blocks are configured to provide the precharge signal to the second precharge blocks.

15. The method of claim 14, further comprising:

providing a precharge signal to the first precharge blocks in the first side of the array for precharging the first bitlines to a supply voltage; and providing the precharge signal to the second precharge blocks in the second side of the array for precharging the second bitlines to the supply voltage.

16. The method of claim 15, wherein:

the first delay block is configured to delay the precharge signal provided to the first precharge blocks that is used to precharge the first bitlines to the supply voltage with the first precharge burst in the multi-burst precharge event, and the second delay block is configured to delay the precharge signal provided to the second precharge blocks that is used to precharge the second bitlines to the supply voltage with the second precharge burst in the multi-burst precharge event.

* * * * *